(12) United States Patent
Ogami et al.

(10) Patent No.: US 7,406,674 B1
(45) Date of Patent: Jul. 29, 2008

(54) METHOD AND APPARATUS FOR GENERATING MICROCONTROLLER CONFIGURATION INFORMATION

(75) Inventors: Kenneth Y. Ogami, Bothell, WA (US); Doug Anderson, Edmund, WA (US); Matthew Pleis, Carnation, WA (US); Frederick Redding Hood, III, Auburn, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 940 days.

(21) Appl. No.: 10/002,726

(22) Filed: Oct. 24, 2001

(51) Int. Cl.
G06F 17/50 (2006.01)

(52) U.S. Cl. .................. 716/17; 716/1; 716/16

(58) Field of Classification Search ............. 716/1, 716/16, 17, 18; 703/22; 326/37–41
See application file for complete search history.

(56) References Cited

U.S. PATENT DOCUMENTS

| | | | |
|---|---|---|---|
| 6,223,144 B1 * | 4/2001 | Barnett et al. | 703/22 |
| 6,460,172 B1 | 10/2002 | Insenser Farre et al. | 716/17 |
| 6,578,174 B2 * | 6/2003 | Zizzo | 716/1 |
| 6,594,799 B1 * | 7/2003 | Robertson et al. | 716/1 |
| 6,825,689 B1 * | 11/2004 | Snyder | 326/41 |

\* cited by examiner

*Primary Examiner*—Vuthe Siek

(57) ABSTRACT

A method and apparatus for configuring a microcontroller. An XML description of the microcontroller's hardware resources may be accessed. A user may select from available hardware resources and pre-defined user modules to select a configuration. Configuration information, which may include register bit patterns and microprocessor instructions, may be automatically generated. Additionally, application programming interface calls and structure, as well as interrupt vector tables may be automatically generated. Embodiments of the present invention provide improved ease of use and the ability to manage greater complexity in the configuration of configurable microcontrollers.

36 Claims, 14 Drawing Sheets

100

```
START
  ↓
ACCESS DESCRIPTION OF HARDWARE RESOURCES
110
  ↓
SELECT AVAILABLE CONFIGURATIONS TO CREATE SELECTED
CONFIGURATION
120
  ↓
GENERATE CONFIGURATION INFORMATION
130
  ↓
GENERATE MICROPROCESS INSTRUCTIONS TO PRODUCE
CONFIGURATION
140
  ↓
GENERATE APIs
150
  ↓
GENERATE INTERRUPT VECTOR TABLE CORRESPONDING TO
INTERRUPTS OF SELECTED CONFIGURATION
160
  ↓
FINISH
```

FIGURE 1

```xml
<!--Project DB Ver 0.03 08/10/00-->
<DEVICE_DB>
  <USER_MODULE_LIST>
    <!--Variable Resolution Incremental ADC-->
    <USER_MODULE NAME="ADCEXP" TYPE="PSOC_ADC" HTML="ADCEXP.HTM" ICON ="ADC.ico" METAFILE="ADCEXP.emf"
      API_PATH_TYPE="CUSTOM">
      <SHAPESHAPE_TYPE="BLOCKLIST">
      <BLOCK_LIST>
        <BLOCK NAME="ADC" TYPE="ANALOG_SC">
          <REGISTER_LIST>
            <REGISTER NAME = "CR0">
              <BITFIELD_LIST>
                <BITFIELD NAME="OSZ" VALUE="OSZ_32"/>
                <BITFIELD NAME="CLOCK_PHASE" VALUE="PHASE_NORM"/>
                <BITFIELD NAME="SIGN" VALUE="POS"/>
                <BITFIELD NAME="CAP_SIZE" VALUE="16"/>
              </BITFIELD_LIST>
            </REGISTER>
            <REGISTER NAME="CR1">
              <BITFIELD_LIST>
                <BITFIELD NAME="CAP_SIZE" VALUE="0"/>
              </BITFIELD_LIST>
            </REGISTER>
            <REGISTER NAME="CR2" >
              <BITFIELD_LIST>
                <BITFIELD NAME="A_OUT" VALUE="DISABLED"/>
                <BITFIELD NAME="COMP_OUT" VALUE="ENABLED"/>
                <BITFIELD NAME="AZ_PHASE" VALUE="AZ_PHI"/>
```

700

702 <DEVICE_DB>
704 <USER_MODULE_LIST>
706 <USER_MODULE NAME="ADCEXP"...
707 <SHAPESHAPE_TYPE="BLOCKLIST">
708 <BLOCK_LIST>
710 <BLOCK NAME="ADC"...>
712 <REGISTER_LIST>
714 <REGISTER NAME = "CR0">
716 <BITFIELD_LIST>
718 <BITFIELD NAME="OSZ"...

FIGURE 7A

```xml
        <BITFIELD NAME="CAP_SIZE" VALUE="0"/>
      </BITFIELD_LIST>
    </REGISTER>
    <REGISTER NAME="CR3">
      <BITFIELD_LIST>
        <BITFIELD NAME="REF_SELECT" VALUE="COMP"/>
        <BITFIELD NAME="FB_CAP_SELECT" VALUE="PH2_AZ_ENABLE"/>
        <BITFIELD NAME="FB_CAP_GND" VALUE="GND_PHI"/>
        <BITFIELD NAME="SCA_INPUT_MUX_B" VALUE="IN2B"/>
        <BITFIELD NAME="SCB_INPUT_MUX_B" VALUE="IN2B"/>
        <BITFIELD NAME="SBB" VALUE="DISABLE"/>
        <BITFIELD NAME="PWR_SELECT" VALUE="PWR_OFF"/>
      </BITFIELD_LIST>
    </REGISTER>
  </REGISTER_LIST>
  <INPUT_LIST/>
</BLOCK>
</BLOCK_LIST>
<BLOCK_LIST>
<BLOCK NAME="TMR" TYPE="DIGITAL" INTERRUPT_SOURCE="_TMR_INT" INTERRUPT_TYPE="JUMP">
  <REGISTER_LIST>
```

FIGURE 7B

```xml
<REGISTER NAME="DIG_BasicFunction">
  <BITFIELD_LIST>
    <BITFIELD NAME="END" VALUE="IsEnd"/>
    <BITFIELD NAME="CompareType" VALUE="LTorEQ"/>
    <BITFIELD NAME="InterruptType" VALUE="TerminalCount"/>
    <BITFIELD NAME="Function" VALUE="Timer"/>
  </BITFIELD_LIST>
</REGISTER>
<REGISTER NAME="DIG_Input">
  <BITFIELD_LIST>
    <BITFIELD NAME="DataSelecvt" VALUE="High"/>
  </BITFIELD_LIST>
</REGISTER>
```

FIGURE 7B (Continued)

```
<REGISTER NAME="DIG_Output">
    <BITFIELD_LIST>
        <BITFIELD NAME="AUXOutputEnable" VALUE="DISABLE"/>
        <BITFIELD NAME="DigOutputEnable" VALUE="DISABLE"/>
    </BITFIELD_LIST>
</REGISTER>
</REGISTER_LIST>
<INPUT_LIST/>
</BLOCK>
</BLOCK_LIST>
<BLOCK NAME="CNT_LSB" TYPE="DIGITAL">
    <REGISTER_LIST>
        <REGISTER NAME="DIG_BasicFunction">
            <BITFIELD_LIST>
                <BITFIELD NAME="Function" VALUE="Counter"/>
                <BITFIELD NAME="CompareType" VALUE="LTorEQ"/>
            </BITFIELD_LIST>
        </REGISTER>
    </REGISTER_LIST>
```

FIGURE 7C

```xml
<INPUT_LIST>
    <INPUT SOURCE="AnalogOut" TYPE="RESERVED_RESOURCE" REGISTER_NAME="DIG_Input" BITFIELD="DataSelect"/>
</INPUT_LIST>
</BLOCK>
<BLOCK NAME="CNT_MSB" TYPE="DIGITAL" INTERRUPT_SOURCE="_CNT_INT" INTERRUPT_TYPE="JUMP">
<REGISTER_LIST>
<REGISTER NAME="DIG_BasicFunction">
    <BITFIELD_LIST>
        <BITFIELD NAME = "Function" VALUE="Counter"/>
        <BITFIELD NAME = "END" VALUE="IsEnd"/>
        <BITFIELD NAME = "CompareType" VALUE="LTorEQ"/>
    </BITFIELD_LIST>
</REGISTER>
```

FIGURE 7C (Continued)

```xml
<REGISTER_LIST>
<INPUT_LIST>
<INPUT SOURCE="CNT_LSB" TYPE="BLOCK" REGISTER_NAME="DIG_Input" BITFIELD="DataSelect"/>
</INPUT_LIST>
</BLOCK>
</BLOCK_LIST>
<RESOURCE_LIST>
<RESOURCE NAME="AnalogOut" TYPE="ANALOG_COMPARATOR_OUTPUT">  ← 725
<INPUT_LIST>
<INPUT SOURCE="ADC" TYPE="BLOCK"/>   ← 730
</INPUT_LIST>
</RESOURCE>
</RESOURCE_LIST>
</SHAPE>
<PARAMETER_LIST>    ← 740
<PARAMETER NAME="ADCINPUT_SCB" TYPE="INPUT" SOURCE="ADC" REGISTER_NAME="CRI"
BITFIELD="SCB_INPUT_MUX_A"/>
<PARAMETER NAME="ADCINPUT_SCA" TYPE="INPUT" SOURCE="ADC" REGISTER_NAME="CRI"
BITFIELD="SCA_INPUT_MUX_A_C"/>
<PARAMETER NAME="ClockPhase" TYPE="BLOCK" SOURCE="ADC" REGISTER_NAME="CR0"
BITFIELD="CLOCK_PHASE"/>
<PARAMETER NAME="TMRCLK" TYPE="CLOCK" SOURCE="TMR" REGISTER_NAME="DIG_Input"
BITFIELD="ClockSelect"/>
<PARAMETER NAME="CTRCLKL" TYPE="CLOCK" SOURCE="CNT_LSB" REGISTER_NAME="DIG_Input"
BITFIELD="ClockSelect"/>
<PARAMETER NAME="CTRCLKM" TYPE="CLOCK" SOURCE="CNT_MSB" REGISTER_NAME="DIG_Input"
BITFIELD="ClockSelect"/>
```

FIGURE 7D

```
</PARAMETER_LIST>
<API_REGISTER_ALIAS_LIST>
    <API_REGISTER_ALIAS_NAME="AtoDcr0" SOURCE="ADC" REGISTER_NAME="CR0"/>
    <API_REGISTER_ALIAS_NAME="AtoDcr1" SOURCE="ADC" REGISTER_NAME="CR1"/>
    <API_REGISTER_ALIAS_NAME="AtoDcr2" SOURCE="ADC" REGISTER_NAME="CR2"/>
    <API_REGISTER_ALIAS_NAME="AtoDcr3" SOURCE="ADC" REGISTER_NAME="CR3"/>
    <API_REGISTER_ALIAS_NAME="CounterMSBFN" SOURCE="CNT_MSB" REGISTER_NAME="DIG_BasicFunction"/>
```

742 — `</PARAMETER_LIST>` / `<API_REGISTER_ALIAS_LIST>`

744 — `<API_REGISTER_ALIAS_NAME=...>`

FIGURE 7D (Continued)

```xml
<API_REGISTER_ALIAS_NAME="CounterMSBSL" SOURCE="CNT_MSB" REGISTER_NAME="DIG_Input"/>
<API_REGISTER_ALIAS_NAME="CounterMSBOS" SOURCE="CNT_MSB" REGISTER_NAME="DIG_Output"/>
<API_REGISTER_ALIAS_NAME="CounterMSBDR0" SOURCE="CNT_MSB" REGISTER_NAME="DATA_0"/>
<API_REGISTER_ALIAS_NAME="CounterMSBDR1" SOURCE="CNT_MSB" REGISTER_NAME="DATA_1"/>
<API_REGISTER_ALIAS_NAME="CounterMSBDR2" SOURCE="CNT_MSB" REGISTER_NAME="DATA_2"/>
<API_REGISTER_ALIAS_NAME="CounterMSBCR0" SOURCE="CNT_MSB" REGISTER_NAME="CONTROL_0"/>
<API_REGISTER_ALIAS_NAME="CounterLSBFN" SOURCE="CNT_LSB" REGISTER_NAME="DIG_BasicFunction"/>
<API_REGISTER_ALIAS_NAME="CounterLSBSL" SOURCE="CNT_LSB" REGISTER_NAME="DIG_Input"/>
<API_REGISTER_ALIAS_NAME="CounterLSBOS" SOURCE="CNT_LSB" REGISTER_NAME="DIG_Output"/>
<API_REGISTER_ALIAS_NAME="CounterLSBDR0" SOURCE="CNT_LSB" REGISTER_NAME="DATA_0"/>
<API_REGISTER_ALIAS_NAME="CounterLSBDR1" SOURCE="CNT_LSB" REGISTER_NAME="DATA_1"/>
<API_REGISTER_ALIAS_NAME="CounterLSBDR2" SOURCE="CNT_LSB" REGISTER_NAME="DATA_2"/>
<API_REGISTER_ALIAS_NAME="CounterLSBCR0" SOURCE="CNT_LSB" REGISTER_NAME="CONTROL_0"/>
<API_REGISTER_ALIAS_NAME="TimerFN" SOURCE="TMR" REGISTER_NAME="Dig_BasicFunction"/>
<API_REGISTER_ALIAS_NAME="TimerSL" SOURCE="TMR" REGISTER_NAME="Dig_Input"/>
<API_REGISTER_ALIAS_NAME="TimerOS" SOURCE="TMR" REGISTER_NAME="Dig_Output"/>
<API_REGISTER_ALIAS_NAME="TimerDR0" SOURCE="TMR" REGISTER_NAME="Data_0"/>
<API_REGISTER_ALIAS_NAME="TimerDR1" SOURCE="TMR" REGISTER_NAME="Data_1"/>
<API_REGISTER_ALIAS_NAME="TimerDR2" SOURCE="TMR" REGISTER_NAME="Data_2"/>
<API_REGISTER_ALIAS_NAME="TimerCR0" SOURCE="TMR" REGISTER_NAME="CONTROL_0"/>
<API_REGISTER_ALIAS_NAME="Comp_Ctrl" SOURCE="AnalogComp" TYPE="RESERVED_RESOURCE" REGISTER_NAME="AnalogComparatorControl"/>
  </API_REGISTER_ALIAS_LIST>
 </USER_MODULE>
</USER_MODULE_LIST>
</DEVICE_DB>
```

FIGURE 7E

METHOD AND APPARATUS FOR GENERATING MICROCONTROLLER CONFIGURATION INFORMATION

FIELD OF THE INVENTION

Embodiments of the present invention generally relate to the field of microcontrollers. More specifically, embodiments of the present invention pertain to a method and apparatus for generating the configuration information for microcontrollers.

BACKGROUND ART

Microcontrollers function to replace mechanical and electromechanical components in a variety of applications and devices. Microcontrollers have evolved since they were first introduced approximately 30 years ago, to the point where they can be used for increasingly complex applications. Some microcontrollers in use today are also programmable, expanding the number of applications in which they can be used.

However, even though there are a large number of different types of microcontrollers available on the market with a seemingly wide range of applicability, it is still often difficult for a designer to find a microcontroller that is particularly suited for a particular application. Unique aspects of the intended application may make it difficult to find an optimum microcontroller, perhaps necessitating a compromise between the convenience of using an existing microcontroller design and less than optimum performance.

In those cases in which a suitable microcontroller is found, subsequent changes to the application and new requirements placed on the application will likely affect the choice of microcontroller. The designer thus again faces the challenge of finding a suitable microcontroller for the intended application.

One solution to the problems described above is to design (or have designed) a microcontroller customized for the intended application. However, this solution may still not be practical because of the time needed to develop a custom microcontroller and the cost of doing so. In addition, should the design of the intended application be changed, it may also be necessary to change the design of the custom microcontroller, further increasing costs and lead times. Moreover, the option of designing a custom microcontroller is generally only available to very large volume customers.

Application specific integrated circuits (ASICs) may suggest a solution to the problem of finding a suitable microcontroller for an application. However, ASICs can also be problematic because they require a sophisticated level of design expertise, and the obstacles of long development times, high costs, and large volume requirements still remain. Solutions such as gate arrays and programmable logic devices provide flexibility, but they too are expensive and require a sophisticated level of design expertise.

In an effort to overcome some of these disadvantages, some microcontroller suppliers (for example, Cypress MicroSystems in Bothell, Wash.) have started to offer standard parts that combine a microprocessor with several user-configurable "building blocks." These building blocks may be configured to form many standard microprocessor peripherals, as well as to form unique peripherals as may be required by a specific application. Thus, a user of such products may be able to tailor (or configure) such a standard product to meet his specific microcontroller requirements, in less time and at less cost than through other means.

Unfortunately, the process by which such configurable blocks are configured is burdensome. The configurable blocks are designed to have wide application. As such, configuration generally involves setting a large number of bits in a specific sequence in order to define a specific function and interconnection with other blocks.

Many existing microcontrollers also have numerous configuration settings. For example, it is not unusual for a given input/output port to be designed such that it is either input or output, and it may further have a selectable pull up resistor.

In the prior art, the configuration process for both standard microcontrollers and configurable microcontrollers has been similar. A designer would study the device's information data sheets and manually determine the value and order of a long string of bits that would create the desired configuration. Subsequently, this string would be encoded into microprocessor instructions for execution during the early stages of operation, or initialization of the system.

In a very few instances, when a microcontroller has found very high acceptance in a particular application, high level tools have been created to support that particular microcontroller in that particular application. In such cases, a standard configuration is used and various software tools are built based on the standard configuration.

Unfortunately, in most design situations calling for a microcontroller, this is not the case. Configuration has been, for the most part, a labor-intensive manual process. Further, changes in the hardware configuration tend to ripple though to the higher level software, requiring changes and recompilation of application software as well as in any software tools designed to ease the development process. In effect, if the microcontroller hardware changed, the software had to change. Not just the application specific software, but also the software tools (such as compilers) had to change.

SUMMARY OF THE INVENTION

Therefore, it would be advantageous to provide a method and system for the automatic generation of configuration information. A further need exists for a text readable description of the hardware resources of a microcontroller. A still further need exists for the use of open standards in describing configurable hardware.

Embodiments of the present invention provide a method and system for the automatic generation of configuration information. Further embodiments of the present invention provide for a text readable description of the hardware resources of a microcontroller. Still further embodiments of the present invention may use eXtensible Markup Language, an open standard, to describe configurable hardware.

A method and apparatus for configuring a microcontroller is disclosed. An XML description of the microcontroller's hardware resources may be accessed. A user may select from available hardware resources and pre-defined user modules to select a configuration. Configuration information, which may include register bit patterns and microprocessor instructions, may be automatically generated. Additionally, application programming interface calls and structure, as well as interrupt vector tables may be automatically generated.

Another embodiment of the present invention may access predetermined configurations of a microcontroller's hardware resources.

In one embodiment of the present invention, a microcontroller having a number of configurable building blocks may be automatically configured.

In another embodiment of the present invention, user selected configuration choices are combined with predetermined configurations to automatically generate configuration information.

In yet another embodiment of the present invention, user configuration selections are checked against the hardware description for validity.

In still another embodiment of the present invention, a user may edit configurable parameters within a computer implemented graphical user interface.

Embodiments of the present invention provide improved ease of use and the ability to manage greater complexity in the configuration of configurable microcontrollers.

Therefore, these and other objects and advantages of the present invention will become obvious to those of ordinary skill in the art after having read the following detailed description of the preferred embodiments that are illustrated in the various drawing figures.

BRIEF DESCRIPTION OF THE DRAWINGS

FIG. 1 is an illustration of a method of configuring a microcontroller, according to an embodiment of the present invention.

FIGS. 7A, 7B, 7C, 7D and 7E illustrate an exemplary User Module description written in eXtensible Markup Language (XML), as may be used by embodiments of the present invention.

DETAILED DESCRIPTION OF THE INVENTION

Figure 2:
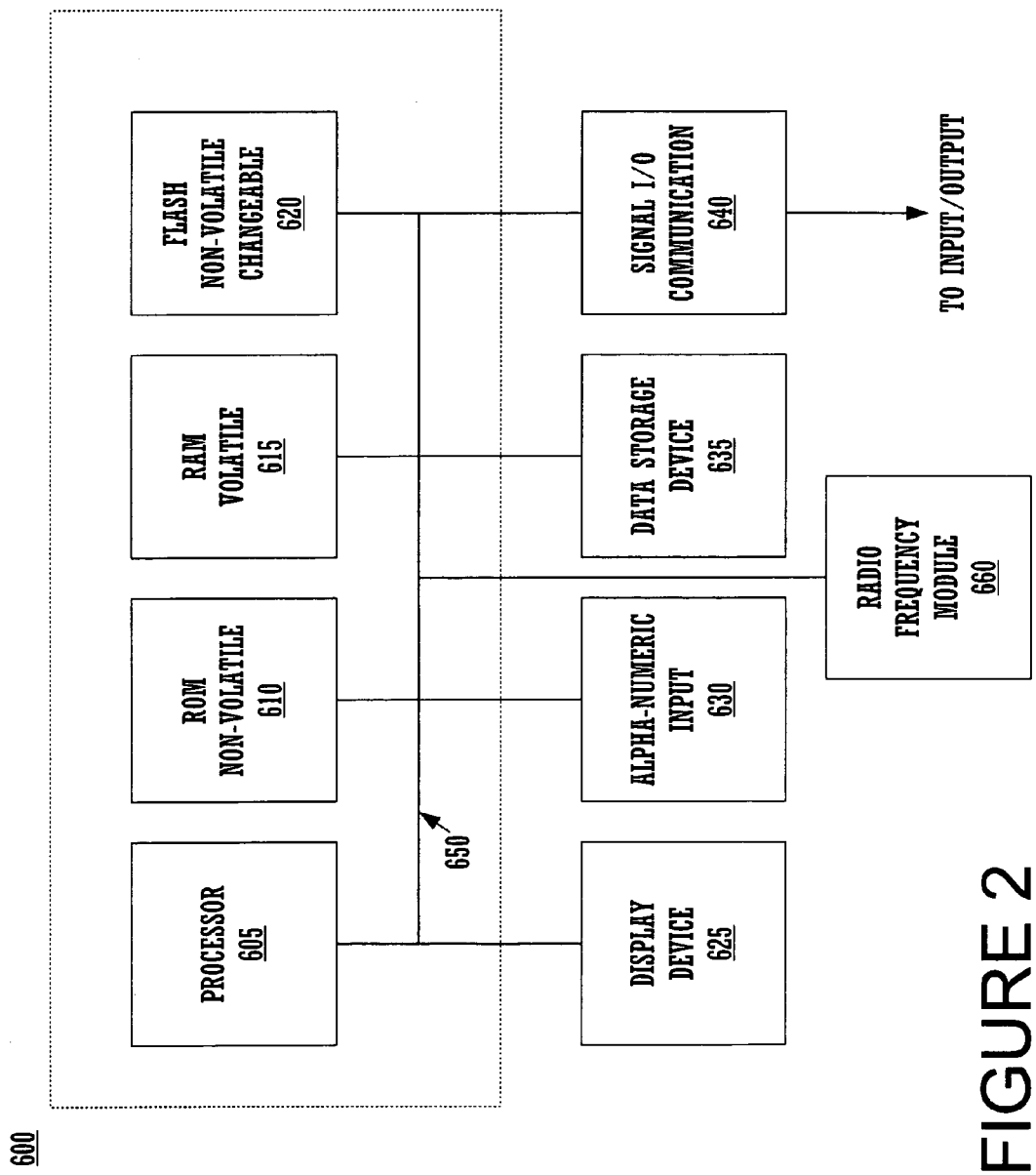
FIG. 2 is a block diagram of a computer system, which may be used as a platform to implement embodiments of the present invention.

In the following detailed description of the present invention, method and apparatus for generating microcontroller configuration information, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., process 100) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "accessing" or "selecting" or "tracking" or "displaying" or "informing" or "editing" or "adding" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Method and Apparatus for Generating
Microcontroller Configuration Information

This application makes reference to co-pending commonly-owned U.S. patent application Ser. No. 10/033,027, filed Oct. 22, 2001, entitled "Programmable Microcontroller Architecture," which is hereby incorporated herein by reference in its entirety.

The present invention is described in the context of development tools for designing with embedded microcontrollers. However, it is appreciated that the present invention may be utilized in other types of computer-aided hardware and software design systems (for example compilers) where it may be necessary to describe various resources.

Traditional microcontrollers have a fixed set of digital and/or analog peripherals. Many of these peripherals may have configurable parameters. For example, a universal asynchronous receiver transmitter (UART) may have provision for several user-selectable configurations. These may include a choice of baud rates, clock sources (internal or external), number of stop bits, parity (even, odd or none), etc. However, all such configuration parameters apply to the same function, that of UART. Such a fixed peripheral generally may not be reconfigured to perform a completely different function, for example, a display controller.

A new class of microcontroller provides an analog and/or digital subsystem comprising many dynamically configurable blocks. An example of such a device is the CY8C25xxx/26xxx family, commercially available from Cypress MicroSystems, Inc., of Bothell, Wash. These blocks do not, in general, provide the equivalent function of a traditional microprocessor peripheral. They may be thought of as fundamental building blocks. However, these blocks may be combined to create such functions. In further contrast to the fixed peripherals of a traditional microcontroller, these blocks may be recombined in a different combination to perform a different function.

Importantly, these different combinations of blocks producing different functions may exist at different times within the same system. For example, a set of blocks configured to perform the function of analog to digital conversion may sample a signal. After processing that signal in the digital domain, those same blocks (perhaps in conjunction with a few others) may be recombined in a different configuration to perform the function of digital to analog conversion to produce an output signal.

The present invention provides a method and system for managing the configuration of and generating configuration information for both traditional microcontrollers with configurable peripherals and this new class of microcontrollers with dynamically configurable blocks.

FIG. 1 illustrates a method 100 of configuring a microcontroller, according to an embodiment of the present invention.

In step 110, a description of the hardware resources may be accessed. This description may include a definition of the underlying hardware, i.e., what peripherals or configurable blocks are available, and the configurable parameters that must be set to operate. In a preferred embodiment of the present invention, the underlying hardware is described in well understood names versus mnemonics, e.g., "conversion_complete_interrupt" versus "INT6." It is appreciated that other well-known naming conventions are well suited to embodiments of the present invention.

In a preferred embodiment, this description is a data set, which may be contained in a plurality of files substantially compliant with extensible Markup Language, or XML.

XML is a well-known open standard, and is text based. As a text based structure, a wide variety of computer tools may be used to create and edit such a description. Being text based, it is also compatible with the widest variety of network transmissions and can be easily transferred between computers having different character set descriptions, such as ASCII and EBCDIC. Descriptions having non-text characters may be more limited in their applications.

It is appreciated, however, that embodiments of the present invention are well suited to other well-known data formats.

In an embodiment of the present invention, a separate software tool accesses the descriptive data set. A significant benefit of separating the data set from the software tool is that the software tool does not have to change (e.g., re-writing or recompiling) if the hardware changes. Only the data set needs to be modified to reflect such a change. Changes to a text based data file are significantly less complex than changes to executable software.

Additional benefits derive from this arrangement as well. For example, supporting new hardware may only require the mere addition of new files into a module library (directory). Additionally, the hardware description files may be used across a variety of computer platforms and operating systems. Further, since the software tool isn't changing with each new or modified piece of hardware, engineering resources may be dedicated to increasing the quality of the software, rather than supporting new functionality.

This description may also include lists of standard configurations that have been predetermined, either by the users or the manufacturers, to be useful. Such a configuration in a traditional microcontroller might be "RS-232 9600 baud," which would be a set of bit patterns to configure the (fixed function) UART to select the appropriate clock source, stop bits, parity, etc. for this standard form of communication.

Similarly, a standard configuration of configurable blocks might be an analog to digital converter labeled "6_bit_ADC." This standard configuration would combine analog and digital blocks to produce a six-bit analog to digital converter.

We label such standard configurations as user modules, and such user modules may be defined in the description of hardware resources.

Still referring to FIG. 1, in step 120 a user, typically interacting with a computer implemented design tool, may select from available configurations, including user modules and other capabilities of the microcontroller hardware, to produce a desired configuration.

In a preferred embodiment of the present invention, the design tool may track resources as they are assigned, providing feedback to the designer such as available blocks and user modules. It is appreciated that such feedback is not required in embodiments of the present invention.

In step 130, the bit patterns corresponding to the selected configuration may be automatically generated. In optional step 140, microprocessor instructions may be generated which, when executed cause the hardware to be configured according the selected configuration.

In optional step 150, application programming interface (API) call structures may be automatically generated. Such APIs may correspond to user modules. For example, using the previous example of "6_BIT_ADC," an API call might take the form of "GET_6_BIT_ADC_VALUE." Using meaningful names in such an automatically generated structure is more useful to human designers who must maintain the software than pseudo-random unique names generated by computer processes, such as "ZYX-1." Microprocessor instructions required to perform this task and return the value to the calling software may be automatically generated.

In optional step 160, an interrupt vector table may be automatically generated. Again using the example of "6_BIT_ADC," instructions to set the "conversion complete" interrupt to level 6 may be automatically generated. Further, instructions to initialize the interrupt vector corresponding to level 6 may be automatically generated, and a shell for the interrupt service routine may be automatically created. Finally, since this example also includes an API, the shell software may be completed to, for example, read the result register from the "6_BIT_ADC" and place that value on the stack to be passed back to the calling program.

FIG. 2 illustrates circuitry of computer system 600, which may form a platform for the implementation of embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and a non-volatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605, which can be updated after the manufacture of system 600.

Computer system 600 also optionally includes a data storage device 635 (e.g., a rotating magnetic disk) coupled with the bus 650 for storing information and instructions.

Also included in computer system 600 of FIG. 2 is an optional alphanumeric input device 630. Device 630 can communicate information and command selections to the central processor 600. Device 630 may take the form of a touch sensitive digitizer panel or typewriter-style keyboard. Display device 625 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 640 is also coupled to bus 650.

System 600 optionally includes a radio frequency module 660, which may implement a variety of wireless protocols, for example IEEE 802.11 or BLUETOOTH™ telecommunication and computer communications (BLUETOOTH is a trademark of Bluetooth SIG, Inc., Washington D.C.).

Figure 3:
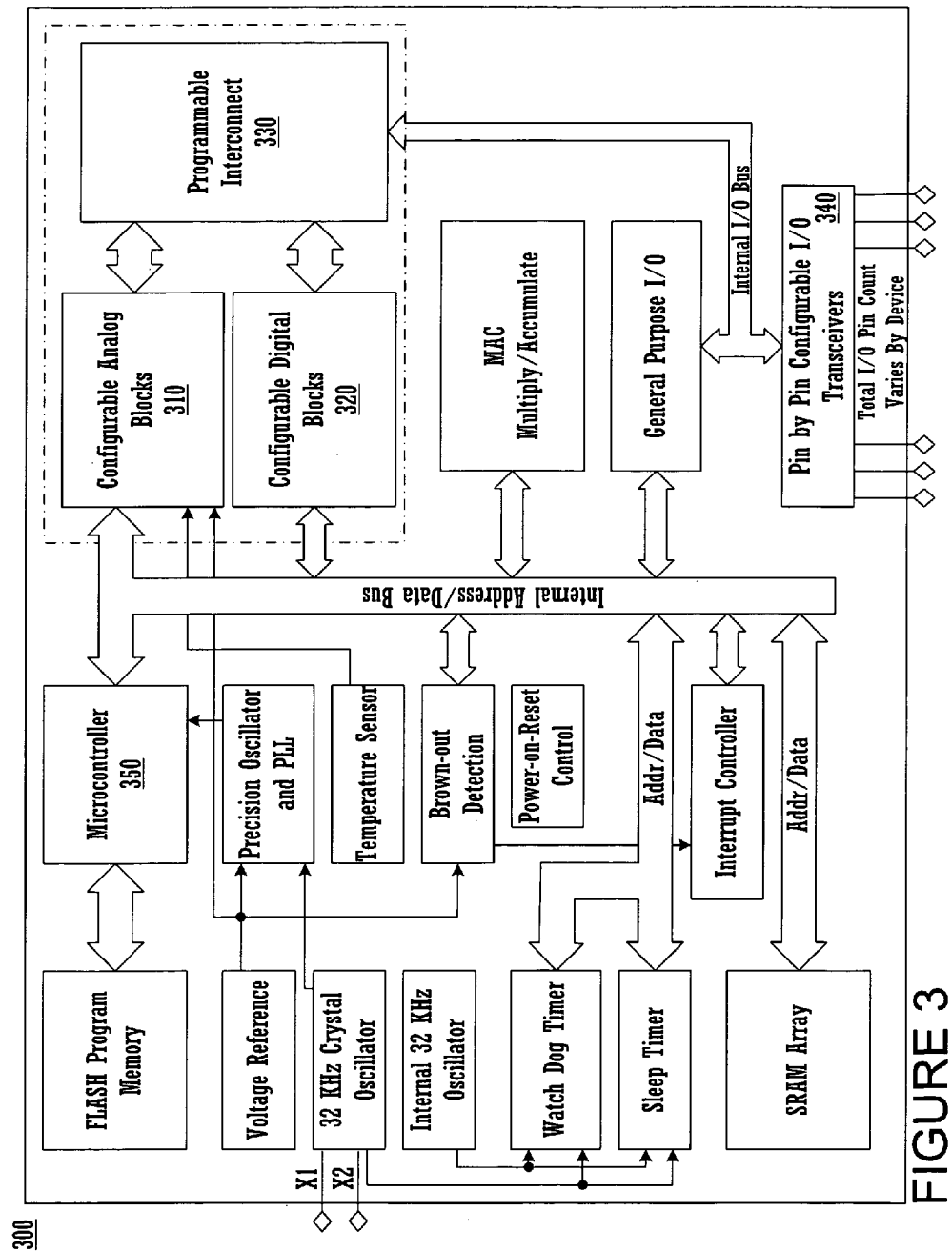
FIG. 3 illustrates an exemplary configurable microcontroller system, upon which embodiments of the present invention may be practiced.

FIG. 3 illustrates an exemplary configurable microcontroller system 300, upon which embodiments of the present invention may be practiced. It is appreciated that the present invention is well suited to a wide range of well know and future configurable microcontroller systems.

Microcontroller system 300 may contain microcontroller 350. Microcontroller 350 may execute instructions stored within memory elements of microprocessor system 300 to configure configurable elements of microcontroller system 300, including configurable analog blocks 310, configurable digital blocks 320, programmable interconnect 330 and configurable I/O transceivers 340. Configuration information for these configurable elements may have been generated by embodiments of the present invention.

Microcontroller system 300 may include configurable analog ("PSOC") blocks 310. "PSOC" is a trademark of Cypress MicroSystems of Bothell, Wash., for a programmable, dynamically configurable microcontroller. Configurable analog blocks 310 may be an array of low level building level building blocks designed to implement analog functions. Similarly, configurable digital blocks 320 may be an array of low level building blocks designed to implement digital functions.

Programmable interconnect 330 may be an array of configurable multiplexing elements designed to interconnect low level building blocks together and with other system resources. Configurable I/O transceivers 340 allow signals created or accessed by configurations of building blocks to communicate off-chip.

Figure 4:
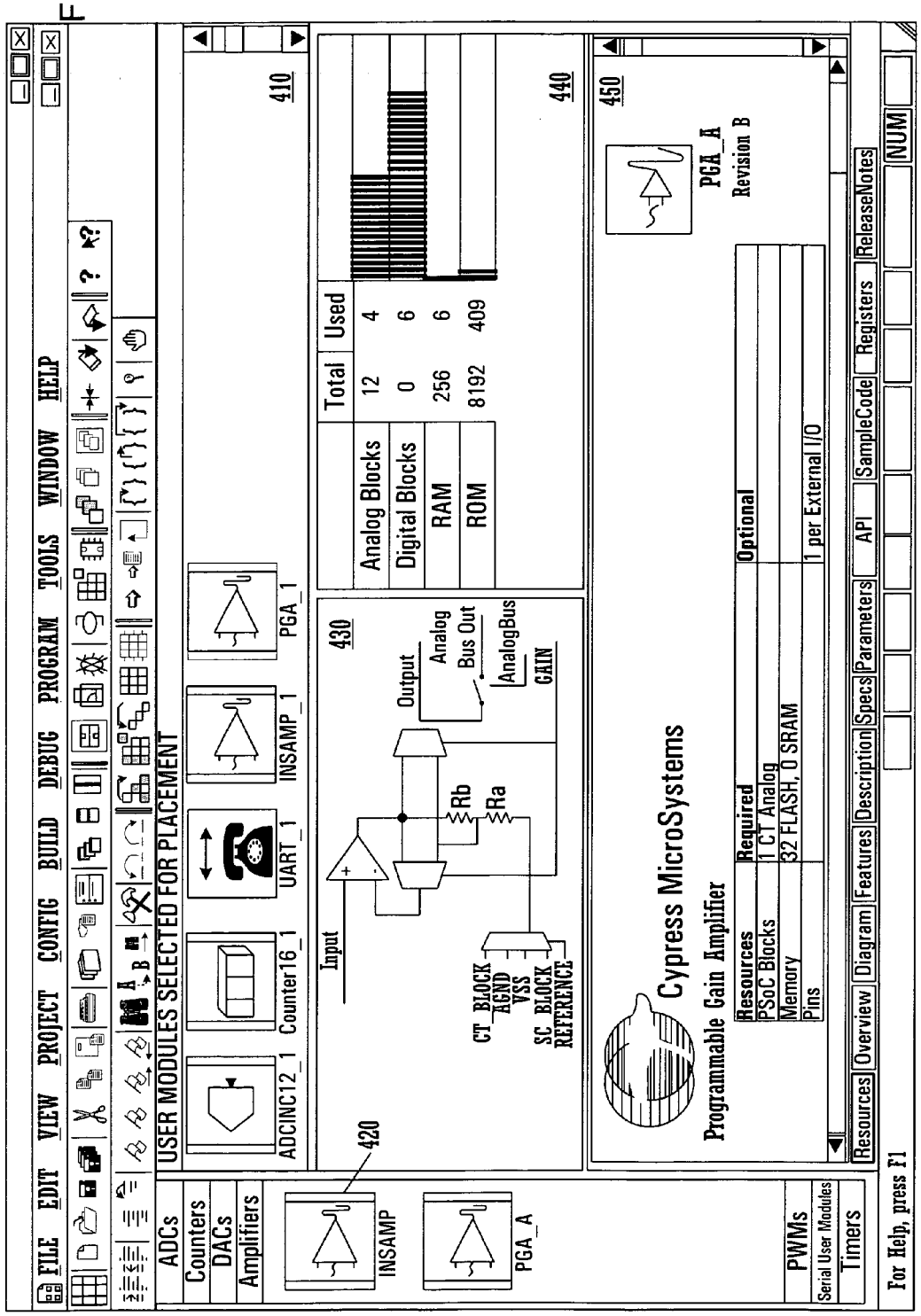
FIG. 4 shows an exemplary User Module selection display, according to an embodiment of the present invention.

FIG. 4 shows an exemplary User Module selection display 400, according to an embodiment of the present invention. User Module selection display 400 may contain User Module Catalog window 420. User Module Catalog window 420 may display all User Modules automatically loaded from the User Module libraries. The User Modules may be organized by type. The displayed names correspond to the type of the User Module.

User Module Selection Bar 410 may display the User Modules selected for the current project. The instance name for the User Module may be shown below the icon in User Module Selection Bar 410. The instance name can be changed at any time before code generation.

Block Diagram 430 and Data Sheet 450 correspond to the User Modules highlighted in the User Module catalog window 420. Block Diagram 430 may provide a block diagram of the highlighted user module, and may indicate configurable elements of the user module.

Data Sheet 450 may display a detailed datasheet for the selected user module, as would have been contained in a data book or accessed via the world wide web in prior art systems. In this manner, a designer has immediate access to detailed engineering information regarding the selected user module, without having to refer to a printed book, or open an internet browser window which may obscure his work.

Embodiments of the present invention may be configured to allow only User Modules that are seen in the User Module Selection bar 410 to be placed during User Module placement.

Resource assignment window 440 may display the total resources available in a particular device, and a summary of the resources used as they are placed into the design. Resource assignment window 440 may display a summary of resources used/assigned in numerical and/or bar graph formats.

Resource assignment window 440 may further change the color of the graph, for example, to yellow, to indicate that a specific resource, for example digital blocks, are almost used up. In addition, resource assignment window 440 may display the graph in yet another color, for example red, to indicate that all available resources of a particular type have been used.

Figure 5:
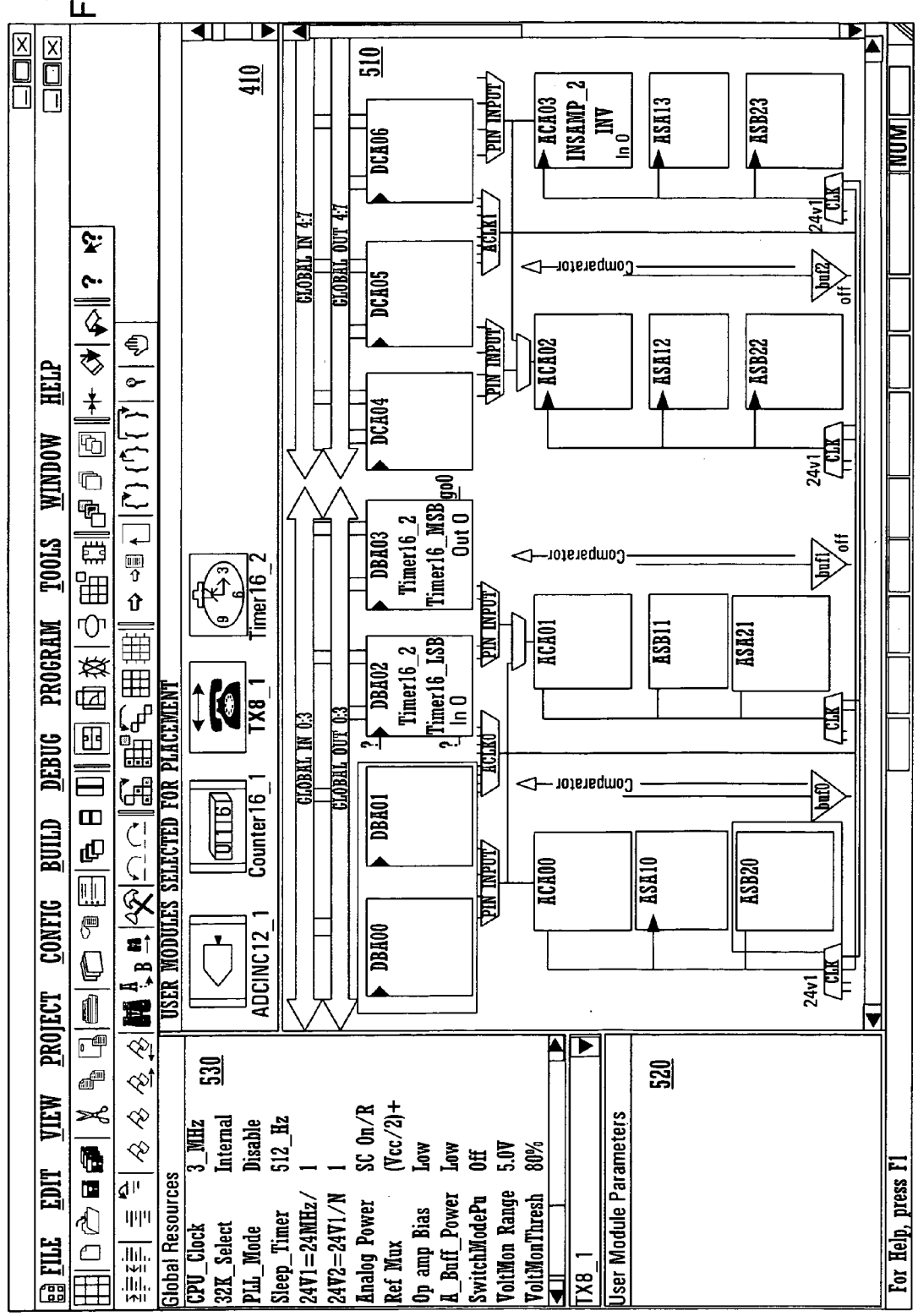
FIG. 5 shows an exemplary User Module placement display, according to an embodiment of the present invention.

FIG. 5 shows an exemplary User Module placement display 500, according to an embodiment of the present invention. User Module placement involves the placement of selected User Modules onto the configurable blocks 310 and/or 320 available on the selected device.

User Module placement display 500 may include placement pane 510. Placement pane 510 may display a graphical representation of placed blocks and signal routings. The graphical placement and routing may correspond to the physical placement of such blocks on an integrated circuit, or the graphical placement and routing may correspond to simplified renderings of the microcontroller architecture.

Placed User Modules may have colored rectangles around their icons in the User Module Selection Bar 410 and one or more blocks in the Placement Pane 510 may be colored with the same color. The instance name and block name will also be shown on the corresponding blocks. Embodiments of the present invention may be configured to allow only placed User Modules to be parameterized and included in application generation.

User Module placement display 500 may also include global resources window 530 that displays a list of the global resources available in the chosen device.

User Module placement display 500 may further include user module parameters window 520 that displays a list of configurable parameters for the user module selected in user modules selection bar 410. In this example, there are no user configurable parameters for the selected user module "TX8_1."

Figure 6:
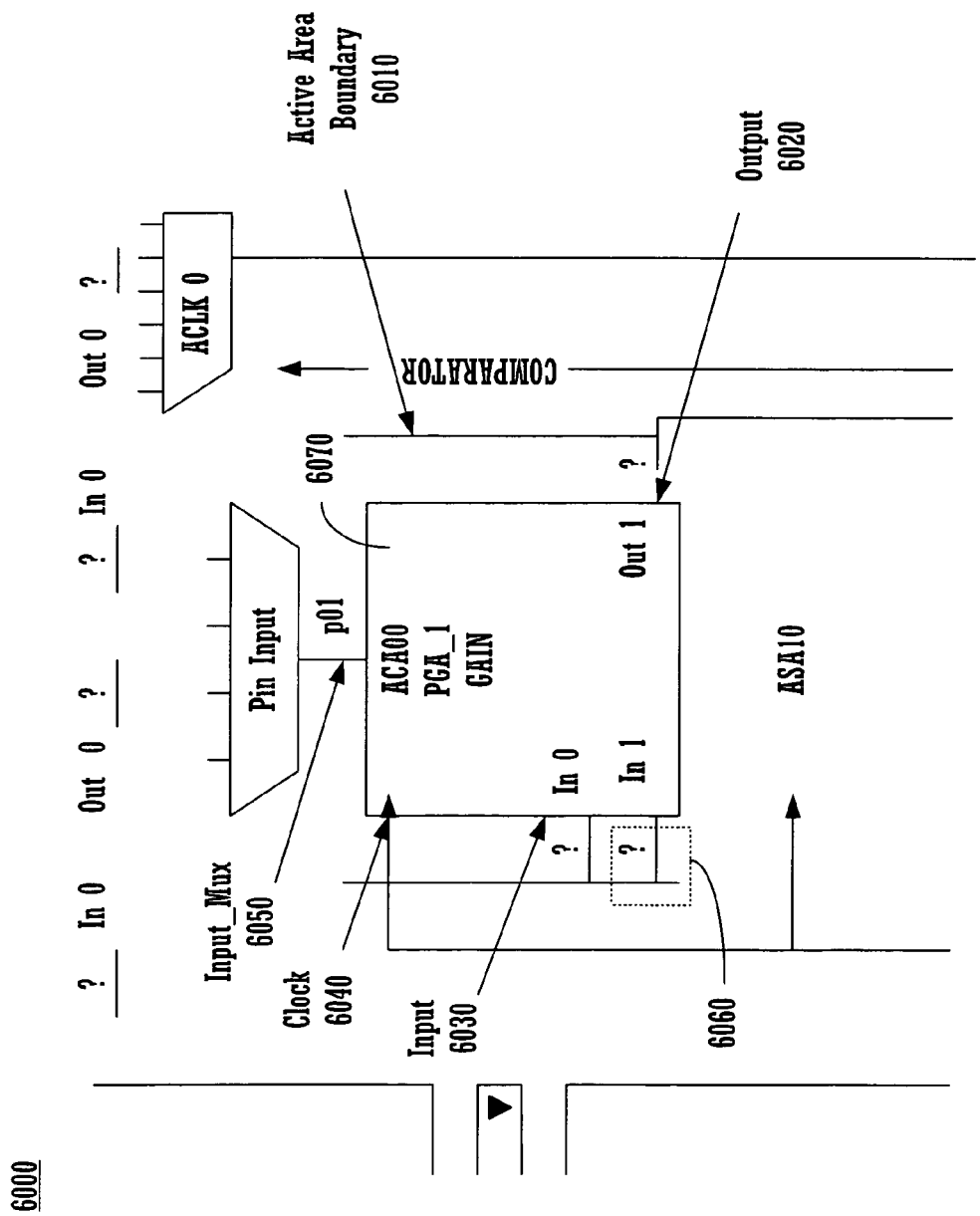
FIG. 6 shows an exemplary screen detail of elements of FIG. 5, according to an embodiment of the present invention.

FIG. 6 shows an exemplary screen detail 6000, which is a detail of placement pane 510. Detail 6000 shows the active areas for block parameters, in particular block 6070, which may be displayed or edited by a user. In general, the active areas for the cursor indicator on block 6070 associated with the parameter may be within the graphical representation of the block 6070 immediately surrounding the text block and outside the block 6070 immediately adjacent to the text block while extending to the end of the active area boundary line 6010.

When the mouse or other pointing device causes a cursor indicator (not shown) to move within the active area of a parameter, for example parameter text area 6060, the cursor may change to a horizontal Dual In-line Package (DIP) shape. If the cursor is left over the active area for about one second, then a tool tip may appear showing the name of the parameter and its value.

The parameter value may be shown in the active area of the parameter immediately above the line, for example parameter area 6060. If the parameter value has not yet been set, then the line may be rendered in an indicator color, for example, red, and a question mark may be displayed in place of the parameter value. The question mark may also be displayed in the same indicator color.

The CLOCK parameter 6040 may always map to an area in the upper left corner of the block 6070. Embodiments of the present invention may be configured so that there is only one parameter whose TYPE attribute is set to CLOCK in any one configurable block within any User Module. The CLOCK parameter does not have a text block similar to parameter text area 6060, but shows the triangle symbol within the block 6070.

The INPUT 6030 parameters (including parameter text area 6060) appear in the lower left area of the block 6070. A maximum of 2 inputs can be shown on a block. The text may always be shown as "In 0" or "In 1" that are assigned in alphabetical order of the INPUT parameters. If only one INPUT parameter is defined for a particular block, then that input will appear at the bottom of the block and be shown as "In 0."

The INPUT-MUX parameter 6050 is a special case parameter that may cause the line to be drawn between the top row of configurable analog blocks, the ANALOG-CT blocks, and the Pin Input MUX control above them. The INPUT-MUX 6050 parameter does not have a bitfield associated with it, so the BITFIELD attribute should be set to NONE. Consequently, an INPUT-MUX 6050 parameter will not appear in the Parameter Pane. The value shown next to the line is controlled by the Pin Input MUX control above. The INPUT-MUX 6050 parameter may only be used with ANALOG-CT blocks.

The OUTPUT 6020 parameters appear in the lower right area of the block. A maximum of 2 outputs can be shown on a block. The text may be always shown as "Out 0" or "Out 1" that are assigned in alphabetical order of the OUTPUT parameters. If only one OUTPUT parameter is defined for a particular block, then that parameter will appear at the bottom of the block and be shown as "Out 0."

The OUTPUT_0 and OUTPUT_1 parameters are similar to the OUTPUT 6020 parameter except that the position of each parameter type is fixed in the block and the line outside the block is extended to connect to one of the two bus lines to the right of the blocks. The OUTPUT_0 parameter appears in the upper output position and the line extends to the comparator bus line. The OUTPUT_1 parameter appears in the lower output position and the line extends to the analog bus line.

The OUTPUT_0_HIDDEN and OUTPUT_1_HIDDEN parameters are similar to the OUTPUT_0 and OUTPUT_1 parameters, except that the "HIDDEN" implies that the parameter value itself is not made available to the GUI. For these parameters, the lines are drawn to the respective bus line, but the text block within the block and the parameter value may not be shown.

FIGS. 7A, 7B, 7C, 7D and 7E illustrate an exemplary User Module description 700 written in extensible Markup Language (XML), as may be used by embodiments of the present invention.

The syntax of XML files follows other mark-up languages in that it consists of tags, which represent elements. Elements can contain attributes, and, in turn, attributes have values. All names in XML files, whether they are tag names, attribute names, or attribute values, are case sensitive.

The user module description 700 may contain data including user module resource requirements, interconnection details, parameter description, and API code generation substitutions. Ultimately, the user module description 700 may define registers, which are divided into bitfields. Bitfields may be set according to User Module placement and parameterization, thereby setting registers. The bitfields are associated with resources, which are presented to the user, for example in screen detail 6000. The resources are also how the GUI and the User Module XML file access the bitfields.

The specific device description files reference the base device description file and may define the pins that are available on the part and the RAM and ROM that is available on the part. The specific device description files also cover all parts that share a common package type insomuch as the package falls into a similar category, for example 28-pin dual-inline package, or 44-pin TQFP. Whether the part is DIP or TSOP does may not distinguish it as a distinct part description. In other words, if a part shares a common pinout, including total pin count, with another part, then it may share a specific device description file.

According to an embodiment of the present invention, the values of some of the attributes in user module description 700 are controlled by the names used in the Device Description XML files, while others are controlled by the elements and attributes in the User Module XML file itself. Each User Module XML file may contain the specifications for one, and only one User Module. From the root node <DEVICE_DB> 702, the User Module XML file may contain one-and-only-one <USER_MODULE_LIST> 704 element. The <USER_MODULE_LIST> 704 element can contain a multiplicity of <USER_MODULE> elements, for example <USER_MODULE_LIST> 706, but generally will contain only one. The <USER_MODULE> element may have the following attributes as described below.

A NAME attribute may be the name of the User Module. A TYPE attribute may be the enumerated type of User Module. "HTML" attribute may be the name of file containing a User Module data sheet, for example data sheet 450 in FIG. 4. The ICON attribute may be the name of file containing a User Module icon graphic. METAFILE attribute may be the name of file containing User Module block diagram. API_PATH_TYPE attribute may be the XML file path relative to other files. RAM attribute may be the amount of RAM used by the User Module API. ROM attribute may be the amount of ROM used by the User Module API The NAME attribute is the reference for the User Module used by an editor (configuration editing software). It is also the name that appears in under the icon in the User Module Catalog on the User Module Selection view.

The TYPE attribute is an enumeration that places the User Module in a category. The User Modules types serve to partition the User Modules onto the different Outlook bars in the User Module catalog.

The HTML, ICON, and METAFILE attributes relate to the other files used in the User Module Selection view. All of these attribute values are the literal file names that must include the extension. The HTML attribute specifies the data sheet file that is displayed in the Data Sheet area of the view. The METAFILE attribute specifies the extended metafile that contains the User Module block diagram. The block diagram appears in the Block Diagram pane of the User Module Selection view. The ICON attribute specifies the file containing the User Module icon. The icon is used in the User Module Catalog pane and the User Module Selection Bar.

The RAM and ROM attributes are the values used to determine the resource usage for the User Module. The values of the RAM and ROM attributes are subtracted from the total amount available on the device when the User Module is selected. The resource usage gauge in the configuration tool tracks the RAM and ROM usage for the User Modules selected in the current configuration.

The API_PATH_TYPE attribute specifies the relative path between the User Module XML file and the other files. With the current library scheme, all User Modules should be set for CUSTOM. The other value, NORMAL is not used or the attribute should not be included.

The <USER_MODULE> element may contain one, and only one of each of the following elements: <SHAPE>, <PARAMETER_LIST> and <API_REGISTER_ALIAS_LIST>.

The <SHAPE> element, for example <SHAPE> element 707, specifies the configurable blocks and the resources required by the User Module, and establishes some reference names for use in other parts of the User Module description. The <SHAPE> element has only a SHAPE_TYPE attribute. The SHAPE_TYPE attribute may be set to BLOCK_LIST.

The <SHAPE> element consists of one or more <BLOCK_LIST> elements, for example <BLOCK_LIST> element 710, and at most one <RESOURCE_LIST> element.

The <BLOCK_LIST> element describes a collection of configurable blocks that are connected between blocks within the <BLOCK_LIST> element. When multiple <BLOCK_LIST> elements are included within a <SHAPE> element, each <BLOCK_LIST> is placed on the device's configurable blocks independently. Connections between configurable blocks from distinct <BLOCK_LIST> elements can exist through resources identified in the <RESOURCE_LIST> element.

The <BLOCK_LIST> has no attributes and consists of several <BLOCK> elements, for example <BLOCK> element 710. The <BLOCK> elements specify the following information: Block name, the type of block required, Block interrupt generation, Block personalization and Block interconnection.

The <BLOCK> element may have the attributes described below. NAME attribute may be the block reference name. The TYPE attribute may be the enumerated PSoC block type. The INTERRUPT_SOURCE attribute may be the block interrupt handler name. The INTERRUPT_TYPE attribute may be the enumerated interrupt calling type.

The NAME attribute is a local name that identifies the block within the User Module description. The NAME must be unique within a User Module, but similar names can be used in different User Modules. The NAME attribute value appears in the GUI in the User Module Placement view. When a User Module is placed, the configurable blocks onto which the User Module is placed show the instance name of the User Module with the local name directly under it.

The TYPE attribute specifies the type of configurable block that the User Module requires. The valid values for the TYPE attributes include: DIGITAL, DIGITAL_COMM, ANALOG_CT, ANALOG_SCA, ANALOG_SCB and ANALOG_SC.

The difference between this list and the configurable block types used in the device description is the addition of the ANALOG_SC type in the User Module description. The ANALOG_SC block type indicates that the specified block can be placed on an ANALOG_SCA or an ANALOG_SCB block. Similarly, a DIGITAL block type can be placed on a DIGITAL or a DIGITAL_COMM block.

The INTERRUPT_SOURCE and INTERRUPT_TYPE attributes relate to an interrupt handler associated with the configurable block. If an interrupt handler is not associated with the configurable block, then the INTERRUPT_SOURCE and INTERRUPT_TYPE attributes should not be included in the <BLOCK> element. The INTERRUPT_SOURCE attribute value is a name that is used to generate the interrupt handler name. The INTERRUPT_SOURCE attribute value is appended to the User Module instance name to form the interrupt handler name. The INTERRUPT_TYPE attribute specifies whether a LJMP (long jump) or a CALL (to subroutine) is used when calling the interrupt handler from the vector table.

The <BLOCK> element may consist of one <REGISTER_LIST> element and at most one <INPUT_LIST> element.

The <REGISTER_LIST> element, for example <REGISTER_LIST> element 712, may specify the configurable block personalization. The bitfield values set in this element are set on the configurable block where the User Module is located.

The <REGISTER_LIST> consists of one-or-more <REGISTER> elements, for example <REGISTER> element 714. The <REGISTER> element may have a NAME attribute and one <BITFIELD_LIST> element. The NAME attribute value must match one of the names of the registers in a configurable block of similar type contained in the <COMMON_BLOCK_LIST> element of the device description.

The <BITFIELD_LIST>, for example <BITFIELD_LIST> 716, consists of one-or-more <BITFIELD> elements. The <BITFIELD> elements, for example <BITFIELD> element 718, may have NAME and VALUE attributes. The bitfield NAME attribute must be one of those included in the <BITFIELD_LIST> of a block of similar type contained in the <COMMON_BLOCK_LIST> of the device description. Similarly, the VALUE attribute must be a value that is valid for the specified bitfield as defined in the device description.

The <INPUT_LIST> element, for example <INPUT_LIST> 720 of FIG. 7B, specifies the interconnection between blocks and resources within the User Module description. The <INPUT_LIST> element has no attributes and consists of one-or-more <INPUT> elements. The <INPUT> element specifies a connection between the block and another block or resource within the User Module description. The relevance of an <INPUT> element is that a connection with another configurable block or resource on the device implies that a bitfield within the block registers must be set to a particular value.

The <INPUT> element may have the attributes described below. The SOURCE attribute may be the name of the resource or configurable block that is the source of the input. The TYPE attribute may be an enumeration of the type of the SOURCE, either BLOCK or RESERVED_RESOURCE. The BLOCK_TYPE attribute may be an enumeration of the type of the block on which the block is placed, either ANALOG_SCA or ANALOG_SCB. The REGISTER_NAME attribute may be the name of the register within the block <REGISTER_LIST> containing the relevant bitfield. The BITFIELD attribute may be the name of the bitfield associated with the input.

The SOURCE attribute must match the name of another block or resource within the User Module.

The TYPE attribute must match the SOURCE, whether the SOURCE is a BLOCK or RESERVED_RESOURCE.

The BLOCK_TYPE attribute is only relevant when the TYPE of the <BLOCK> element is ANALOG_SC. In this case, the bitfield for a connection may vary depending on whether the <BLOCK> element was placed on an ANALOG_SCA or an ANALOG_SCB block. If the bitfield is different, then distinct <INPUT> elements specifying both cases must be included in the <INPUT_LIST> element for that <BLOCK> element.

The REGISTER_NAME attribute specifies the NAME attribute of the <REGISTER> element in the <REGISTER_LIST> element of the <BLOCK> that contains the relevant bitfield. If the bitfield name is unique, then the REGISTER_NAME can be omitted, but it is better practice to always include it.

The BITFIELD attribute value specifies the NAME attribute of the <BITFIELD> element that is associated with the input.

The <RESOURCE_LIST> element, for example <RESOURCE_LIST> element 725 of FIG. 7D, specifies the resources that the User Module requires. The User Module uses resources to enable parameterization, enable connection between blocks, or restrict placement options. There may be only one <RESOURCE_LIST> element in a <SHAPE> element. The one <RESOURCE_LIST> element contains all resources used by the User Module.

A <RESOURCE_LIST> consists of one-or-more <RESOURCE> elements. The <RESOURCE> element specifies the type of resource and connections from other blocks or resources in the User Module description. The <RESOURCE> element may have attributes as described below.

The NAME attribute may be the reference name for the resource. The TYPE attribute may be the resource type.

The NAME attribute defines the reference name for the resource within the User Module. The TYPE attribute specifies the type of resource required. Valid values for TYPE may include: COLUMN_INPUT, ANALOG_COLUMN_CLOCK_MUX, ANALOG_CLOCK_SELECT, ANALOG_DRIVER, GLOBAL_BUS, ANALOG_COMPARATOR_OUTPUT, ANALOG_COLUMN_OUTPUT, ANALOG_COMPARATOR_CONTROL, DECIMATOR, ANALOG_MODULATOR, PIN, TEMPERATURE_VOLTAGE and DIRECT_INPUT.

These values correspond to resources in the <RESERVED_RESOURCE_LIST> in the device description.

The <RESOURCE> element contains an <INPUT_LIST> element, for example <INPUT_LIST> element 730 of FIG. 7D. The <INPUT> elements within the <INPUT_LIST> are similar to the <INPUT_LIST> element in the <BLOCK> element. The <INPUT> element for resources may have the following attributes.

The SOURCE attribute may be the name of the resource or configurable block that is the source of the input. The TYPE attribute may be an enumeration of the type of the SOURCE, either BLOCK or RESERVED_RESOURCE. The REGISTER_NAME attribute may be the name of the register within the block <REGISTER_LIST> containing the relevant bitfield. The BITFIELD attribute may be the name of the bitfield associated with the input.

In many cases, the resource does not have a register associated with it. In these cases, the BITFIELD attribute is set to NONE and the REGISTER_NAME attribute can be omitted.

The <PARAMETER_LIST> element, for example <PARAMETER_LIST> element 740 of FIG. 7D, exposes bitfields to the GUI to allow the user to set their values. The <PARAMETER> element associates the parameter with a bitfield defines in the User Module shape. The values shown for the parameters are controlled by the bitfield values or a <PARAMETER_VALUE_LIST> element. The value list can also be limited with an <ALLOWED_VALUE_LIST> element. If a parameter has an ambiguous SOURCE, in terms of block type, then it is possible that the bitfield associated with the parameter has a different name depending on block placement. For example, if the SOURCE block is TYPE ANALOG_SC, then some of the registers have different names for the same bitfield in an ANALOG_SCA block as opposed to an ANALOG_SCB block. In this case, a parameter should be specified for both block types based on the unique register names. When the block is placed, the parameter that does not apply will disappear.

The <PARAMETER_LIST> element may contain at least one <PARAMETER> element. The <PARAMETER> element may have the following attributes. The NAME attribute may be the name of parameter. The TYPE attribute may be the enumeration of parameter type. The SOURCE attribute may be the name of configurable block or resource containing the bitfield associated with the parameter. The REGISTER_NAME attribute may be the name of the register containing the bitfield associated with the parameter. The BITFIELD attribute may be the name of the bitfield associated with the parameter. The ORDER attribute may be the order that the parameters appear in the list. The VALUE attribute may be the default value. The VALUE_TYPE attribute may be ENUM or INT. The default value is ENUM if attribute is missing. The MIN attribute may apply only to VALUE_TYPE=INT, which is the minimum inclusive parameter value. The MAX attribute may apply only to VALUE_TYPE=INT, which may be the maximum inclusive parameter value.

The NAME attribute may be the reference name for the parameter within the User Module. In the User Module Placement view, the NAME attribute is the name that appears in the Parameter Pane grid control. The ORDER attribute determines the order that the parameters appear, where the ORDER "0" parameter is at the top with the remaining parameter listed down in ascending order. If the ORDER attribute is not specified, then the parameters are listed in alphabetical order.

The SOURCE, REGISTER_NAME, and BITFIELD attributes specify the configurable block, or resource, and the bitfield, in the shape that contains the bitfield associated with the parameter. The SOURCE must be set to a NAME included in the <SHAPE> element of a <BLOCK> element, or of a <RESOURCE> element. The REGISTER_NAME and BITFIELD attributes must also be included in the <BLOCK> or <RESOURCE> element. A special keyword for the SOURCE attribute is ALL_DIGITAL. If the SOURCE for a parameter is set to ALL_DIGITAL, then the parameter applies to a similar bitfield for all configurable digital blocks defined in the User Module. This value can be used to set all clocks for the digital blocks to the same value.

The VALUE attribute specifies the default value for the parameter. In the case of a parameter that does not include a <PARAMETER_VALUE_LIST> element, the VALUE attribute must be included in the <BITVALUE_LIST> of the bitfield associated with the parameter. If a <PARAMETER_VALUE_LIST> is included, then the VALUE attribute value must be included in the <PARAMETER_VALUE_LIST> element.

The TYPE attribute may be a UI helper that controls the appearance of parameters on the configurable blocks in the Placement Pane. When a User Module is placed on to the configurable blocks, some of the parameters may be shown on the blocks. When parameters are shown on the configurable blocks, then they may be set from the Placement Pane by clicking on the active area for the parameter on the block, as shown in the Parameter Block Selection screen. The enumerated values of the TYPE attribute determine where on the block the active area for the parameter is shown. The valid values for the TYPE attribute are described below.

The CLOCK attribute may be the clock selection parameter. The INPUT attribute may be the input parameter. The INPUT_MUX attribute may be the special MUX input parameter. The INPUT_HIDDEN attribute may be the hidden parameter for input. The BLOCK attribute may be the general block parameters. The BLOCK_HIDDEN attribute may be hidden parameter for a block. The OUTPUT attribute may be the general output parameter. The OUTPUT_0 attribute may be the output parameter to comparator bus. The OUTPUT_1 attribute may be the output parameter to analog bus. The OUTPUT_0_HIDDEN attribute may be the hidden parameter to comparator bus. The OUTPUT_1_HIDDEN attribute may be the hidden parameter to analog bus. The API attribute may be the parameter not associated with any bitfields.

The preferred embodiment of the present invention, a method and apparatus for generating microcontroller configuration information, is thus described. While the present invention has been described in particular embodiments, it should be appreciated that the present invention should not be construed as limited by such embodiments, but rather construed according to the below claims.

What is claimed is:

1. A method for configuring a microcontroller comprising:
   a) accessing a text readable description of hardware resources of said microcontroller;
   b) selecting available configurations of said text readable description of hardware resources, wherein said selecting produces a selected configuration;
   c) generating executable configuration information corresponding to said selected configuration; and
   c3) generating an interrupt vector table for use by embedded software, wherein a plurality of interrupts included in said interrupt vector table are generated by said selected configuration.

2. The method according to claim 1 wherein said description of said text readable hardware resources of said microcontroller comprises a text readable data structure.

3. The method according to claim 2 wherein said text readable data structure is substantially compliant with extensible markup language.

4. The method according to claim 1 further comprising:
   a1) accessing predetermined configurations of said hardware resources, wherein said predetermined configurations are user modules.

5. The method according to claim 4 further comprising:
   b1) selecting said user modules to produce said selected configuration.

6. The method according to claim 1 further comprising:
   c1) running said executable configuration information to configure said microcontroller.

7. The method according to claim 1 further comprising:
   c2) generating application programming interface calls for embedded software.

8. The method according to claim 7 wherein said application programming interface calls are named according to names given to configurations of hardware resources of said microcontroller.

9. The method according to claim 1 further comprising:
   d) tracking said selected configuration; and
   e) informing the user if said selected configuration is achievable using hardware resources of said microcontroller.

10. A method for configuring a microcontroller containing a plurality of dynamically configurable blocks comprising:
    a) accessing a text based description of said dynamically configurable blocks, wherein said dynamically configurable blocks can be configured to produce a variety of functions and said text based description is not executable software;
    b) selecting available configurations of said dynamically configurable blocks, wherein said selecting produces a selected configuration; and
    c) generating configuration information corresponding to said selected configuration.

11. The method according to claim 10 wherein said text based description of said dynamically configurable blocks is substantially compliant with extensible markup language.

12. The method according to claim 10 further comprising:
    a1) accessing predetermined configurations of said dynamically configurable blocks, wherein said predetermined configurations are user modules.

13. The method according to claim 12 further comprising:
    b1) selecting said user modules to produce said selected configuration.

14. The method according to claim 10 further comprising:
    c1) generating microprocessor instructions for using said configuration information to configure said dynamically configurable blocks.

15. The method according to claim 10 further comprising:
    c2) generating application programming interface calls for embedded software.

16. The method according to claim 15 wherein said application programming interface calls are named according to names given to configurations of said hardware resources.

17. The method according to claim 10 further comprising:
    c3) generating an interrupt vector table for use by embedded software, wherein a plurality of interrupts included in said interrupt vector table are generated by said selected configuration.

18. The method according to claim 10 further comprising:
    d) editing said text based description to reflect changes in said plurality of dynamically configurable blocks.

19. The method according to claim 10 further comprising:
    e) adding a file to a directory to enable the use of a new hardware configuration of said microcontroller.

20. The method according to claim 10 further comprising:
    f) adding a file to a directory to enable the user of a new user module.

21. A system comprising:
    a processor coupled to a bus;
    a memory coupled to said bus and wherein said memory contains instructions that when executed on said processor implement a method for configuring a microcontroller, said method comprising:
    a) accessing a text readable description of a plurality of dynamically configurable blocks of said microcontroller, wherein said dynamically configurable blocks can be configured to produce a variety of functions;
    b) selecting available configurations of said dynamically configurable blocks, wherein said selecting produces a selected configuration; and
    c) generating configuration information corresponding to said selected configuration.

22. A system as described in claim 21 wherein said text readable description of said plurality of dynamically configurable blocks comprises a non-executable software data structure.

23. A system as described in claim 22 wherein said text readable data structure is substantially compliant with extensible markup language.

24. A system as described in claim 21 wherein said method further comprises:
    a1) accessing predetermined configurations of said plurality of dynamically configurable blocks, wherein said predetermined configurations are user modules.

25. A system as described in claim 21 wherein said method further comprises:
    b1) selecting said user modules to produce said selected configuration.

26. A system as described in claim 21 wherein said method further comprises:
   c1) generating microprocessor instructions for using said configuration information to configure said microcontroller.

27. A system as described in claim 21 wherein said method further comprises:
   c2) generating application programming interface calls for embedded software.

28. A system as described in claim 27 wherein said application programming interface calls are named according to names given to configurations of said plurality of dynamically configurable blocks.

29. A computer usable medium having computer readable code stored thereon for causing a computer system to perform a method for configuring a microcontroller, said method comprising:
   a) accessing a text readable description of hardware resources of said microcontroller, wherein said text readable description is not microcontroller executable;
   b) selecting available configurations of said hardware resources of said microcontroller, wherein said selecting produces a selected configuration;
   c) generating microcontroller executable configuration information corresponding to said selected configuration;
   d) generating an interrupt vector table for use by embedded software, wherein a plurality of interrupts included in said interrupt vector table are generated by said selected configuration.

30. The computer usable medium as described in claim 29 wherein said text readable description of hardware resources comprises a text readable data structure.

31. The computer usable medium as described in claim 30 wherein said text readable data structure is substantially compliant with extensible markup language.

32. The computer usable medium as described in claim 29 wherein said method further comprises:
   a1) accessing predetermined configurations of said hardware resources, wherein said predetermined configurations are user modules.

33. The computer usable medium as described in claim 29 wherein said method further comprises:
   b1) selecting said user modules to produce said selected configuration.

34. The computer usable medium as described in claim 29 wherein said method further comprises:
   c1) generating microprocessor instructions for using said configuration information to configure said microcontroller.

35. The computer usable medium as described in claim 29 wherein said method further comprises:
   c2) generating application programming interface calls for embedded software.

36. The computer usable medium as described in claim 35 wherein said application programming interface calls are named according to names given to configurations of said hardware resources.

* * * * *